(12) United States Patent
Newman et al.

(10) Patent No.: US 6,600,344 B1
(45) Date of Patent: Jul. 29, 2003

(54) PREDISTORTION CIRCUIT FOR RF DETECTOR

(75) Inventors: David A. Newman, Tempe, AZ (US); Benjamin R. Gilsdorf, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 418 days.

(21) Appl. No.: 09/605,084

(22) Filed: Jun. 26, 2000

(51) Int. Cl.[7] ............................................. H03K 5/153

(52) U.S. Cl. ......................................... 327/58; 327/61

(58) Field of Search ................................. 327/306, 317, 327/362, 47, 39, 58, 59, 61, 62; 330/149

(56) References Cited

U.S. PATENT DOCUMENTS

| | | | |
|---|---|---|---|
| 5,218,489 A | * | 6/1993 | Jeong et al. .................. 360/70 |
| 5,251,330 A | | 10/1993 | Chiba et al. .................. 455/91 |
| 5,541,907 A | * | 7/1996 | Kurihara et al. ............ 369/124 |

OTHER PUBLICATIONS

D. Su et al., Hewlett–Packard Laboratories, "TP 3.6: An IC for Linearizing RF Power Amplifiers Using Envelope Elimination and Restoration", IEEE, ISSCC, 1998, pp. 54–55.

* cited by examiner

*Primary Examiner*—Dinh T. Le

(57) ABSTRACT

An envelope detector circuit for use in controlling a RF amplifier is provided. The envelope detector circuit includes a first semiconductor device having a first input port that receives a first input signal and a first output port that provides current to charge a capacitor in response to the first input signal. The envelope detector circuit additionally includes a first current drain coupled to the first semiconductor device and the capacitor, where the first current drain conducts current away from the capacitor. The envelope detector circuit further includes a second semiconductor device having a second input port that is set to a biasing voltage and a second output port that is coupled to the first output port of the first semiconductor device. A voltage level of the first output port is indicative of a level of an envelope of the first input signal when the voltage level remains above a threshold voltage equaling the biasing voltage minus a semiconductor voltage, and the voltage level otherwise does not fall below the threshold voltage.

16 Claims, 2 Drawing Sheets

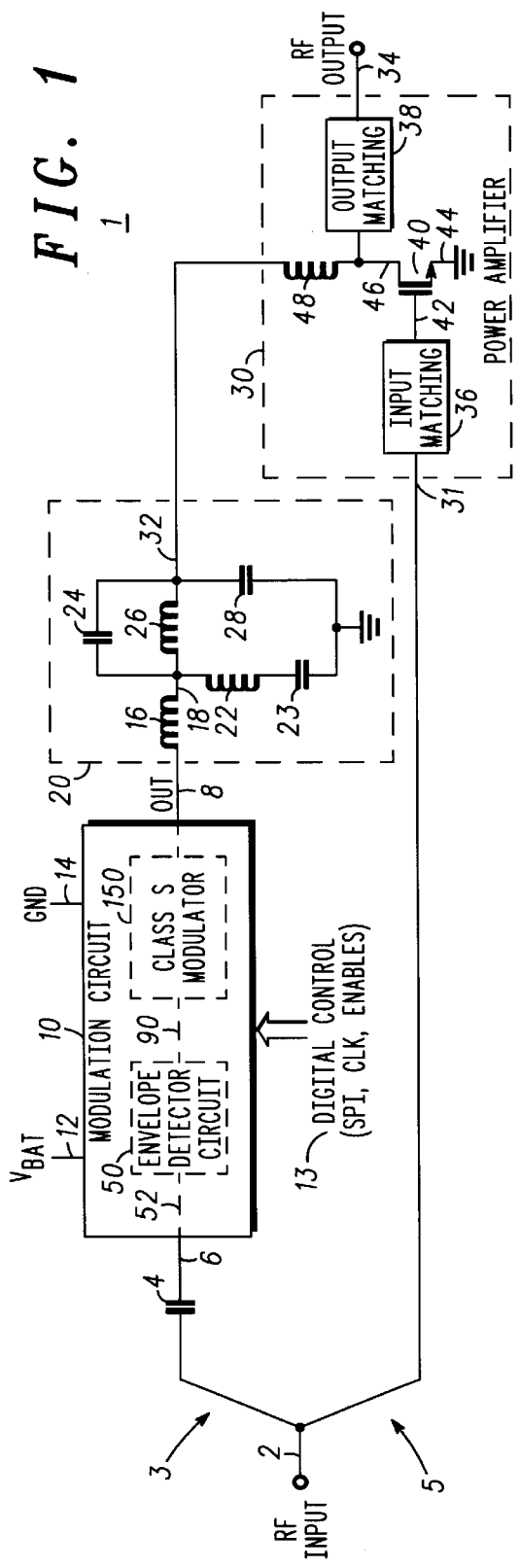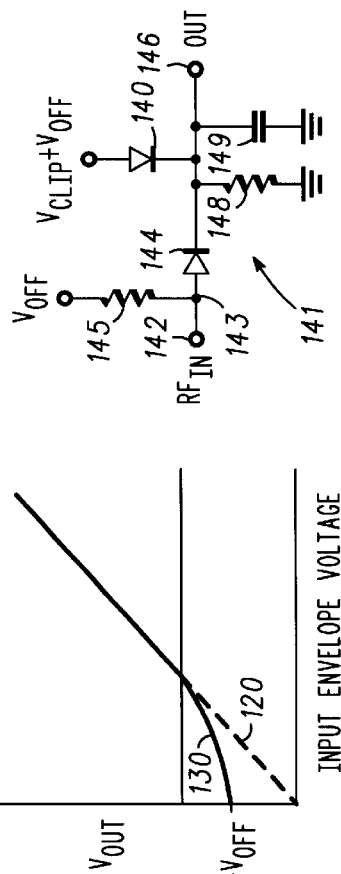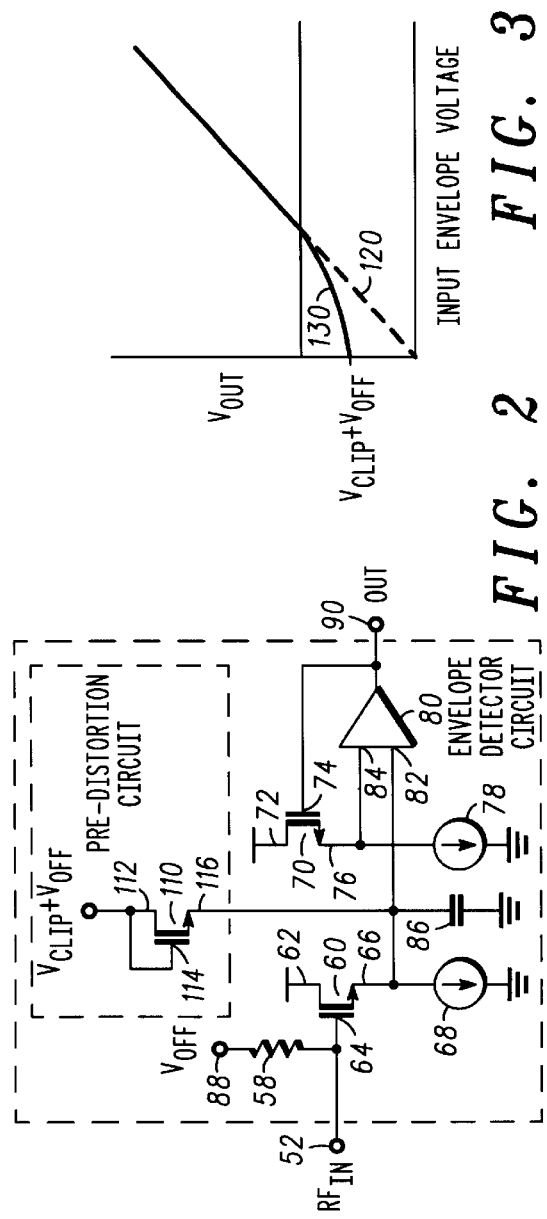

PREDISTORTION CIRCUIT FOR RF DETECTOR

FIELD OF THE INVENTION

The present invention relates generally to radio frequency (RF) transmitter systems for use in cellular telephone handsets and other wireless communications devices. More particularly, the present invention relates to circuits, employed to control the operation of power amplifiers within the transmitter systems.

BACKGROUND OF THE INVENTION

In recent years, the usage of cellular telephones and other wireless communications devices has grown dramatically. Such wireless devices must be able to transmit radio frequency (RF) signals of sufficient strength that the signals can be received at great distances from the wireless devices. To generate such high-intensity output signals, the wireless devices typically include amplifier circuits that amplify low-intensity input signals which have been processed within the wireless devices. To effectively amplify the input signals, the amplifier circuits must amplify the input signals in a linear manner, to avoid distortion.

Due to the limitations inherent in conventional batteries, wireless devices have limited access to power. Consequently, power efficiency is critical to improving the performance of wireless devices, particularly in terms of the timespan over which the wireless devices can operate without being recharged. The amplifier circuits used to generate the high-intensity output signals of the wireless devices are among the most power-intensive circuits of the wireless devices. Consequently, it is desirable that the amplifier circuits within wireless devices operate in both an efficient and a linear manner.

Power amplifiers are frequently utilized in wireless devices as the amplifier circuits for generating the output signals. While maximum efficiency is achieved by such power amplifiers when the power amplifiers are saturated, saturation of the power amplifiers also causes distortion of the output signals and generates interference outside the transmission bandwidth. Thus, some wireless devices include additional envelope detector circuits that are coupled to the power amplifiers in order to bias the power amplifiers toward saturation but within a range of operation in which the power amplifiers are both relatively efficient and linear in operation.

The envelope detector circuits monitor the envelopes or amplitudes of the input signals that are being amplified, and often provide control signals to vary the supply voltages applied to the power amplifiers based upon the envelopes. In particular, the control signals reduce the supply voltages when the envelopes of the input signals are smaller, and increase the supply voltages when the envelopes of the input signals are larger. By controlling the supply voltages that are applied to the power amplifiers, the envelope detector circuits keep the power amplifiers operating within the desired range allowing for efficient and linear operation.

Although the use of envelope detector circuits can guarantee efficient and linear operation of the power amplifiers under many circumstances, the use of envelope detector circuits results in nonlinear operation or even shutdown of the power amplifiers when the amplitudes of the envelopes that are being detected become small.

SUMMARY OF THE INVENTION

The present inventors have recognized that a predistortion circuit can be added to a conventional envelope detector circuit to avoid nonlinear operation or shutdown of a power amplifier. The predistortion circuit allows normal operation of the envelope detector circuit when the input signal to the envelope detector circuit has an envelope that is sufficiently great such that the resulting control signals produced by the envelope detector circuit do not cause the power amplifier to become nonlinear or to shutdown. However, the predistortion circuit causes the envelope detector circuit to produce a control signal that is at or above a minimum threshold when the input signal to the envelope detector circuit has an envelope that is sufficiently small such that, in the absence of the predistortion circuit, the control signals produced by the envelope detector circuit would cause the power amplifier to become nonlinear or shutdown.

In particular, the present invention relates to an envelope detector circuit that preferably includes a first semiconductor device, a first current drain and a second semiconductor device. The first semiconductor device has a first input port that receives a first input signal and a first output port that provides current to charge a capacitor in response to the first input signal. The first current drain is coupled to the first semiconductor device and the capacitor, and conducts current away from the capacitor. The second semiconductor device has a second input port that is set to a biasing voltage and a second output port that is coupled to the first output port of the first semiconductor device. A voltage level of the first output port is indicative of a level of an envelope of the first input signal when the voltage level remains above a threshold voltage equaling the biasing voltage minus a semiconductor voltage, and the voltage level otherwise does not fall below the threshold voltage.

The present invention further relates to, in an envelope detector circuit including preferably a first semiconductor device with a first input port and a first output port, a capacitor and a current drain, where the first output port provides current to charge the capacitor in response to a first input signal provided at the first input port, and the current drain conducts current away from the capacitor, the improvement comprising a predistortion circuit. The predistortion circuit includes a second semiconductor device having at least one port coupled to a biasing voltage and a second port coupled to the first output port of the first semiconductor device. The second semiconductor device provides a signal at the second port which prevents the first output port from falling below a threshold.

The present invention additionally relates to an envelope detector circuit comprising a means for producing an output signal that is indicative of a level of an envelope of an input signal, and a means for limiting the output signal so that the output signal does not fall below a threshold. The output signal is indicative of the level of the envelope of the input signal when the output signal is above the threshold.

The present invention further relates to a method of preventing at least one of nonlinear operation and shutdown of an RF amplifier due to a reduction in a level of an envelope of an input signal to the RF amplifier, where the RF amplifier is biased based at least in part upon the level of the envelope. The method comprises providing an envelope detector circuit, where preferably the envelope detector circuit includes a semiconductor device having an output port that is coupled to a capacitor and a current drain, and the output port is capable of providing an output signal indicative of the level of the envelope of the input signal. The method further comprises coupling a predistortion circuit to the output port of the semiconductor device, and receiving the input signal at the envelope detector circuit. The method additionally comprises maintaining the output signal above a minimum value when the input signal becomes sufficiently small that, in the absence of the predistortion circuit, the output signal would fall below the minimum value, and providing a biasing signal to the RF amplifier, where the biasing signal is functionally related to the output signal.

The present invention additionally relates to amplifier circuits that include envelope detector circuits.

BRIEF DESCRIPTION OF THE DRAWINGS

FIG. 1 is a schematic diagram of an amplifier circuit for use in a wireless communications device;

FIG. 2 is a schematic diagram of element 50 of FIG. 1, which is an envelope detector circuit that includes a predistortion circuit in accordance with the present invention;

FIG. 3 is a graph showing a first transfer relation between an input envelope voltage provided to the envelope detector circuit of FIG. 2 and an output voltage produced by that envelope detector circuit in response to the input envelope voltage, and a second transfer relation between the input envelope voltage and an output voltage produced by a conventional envelope detector circuit in response to the input envelope voltage; and FIG. 4 is a schematic diagram of an alternate embodiment of a predistortion circuit as employed within an envelope detector circuit using a diode.

FIG. 5 is a schematic diagram of an alternate embodiment of an envelope detector circuit that includes a predistortion circuit similar to the envelope detector of FIG. 2. but utilizing bipolar junction transistors in the place of the MOSFETS of the circuit of FIG. 2. Accordingly all the components of the circuit of FIG. 5 are numbered consistently with the circuit elements of FIG. 2, except for the numbering of the bipolar junction transistors themselves.

Figure 5:
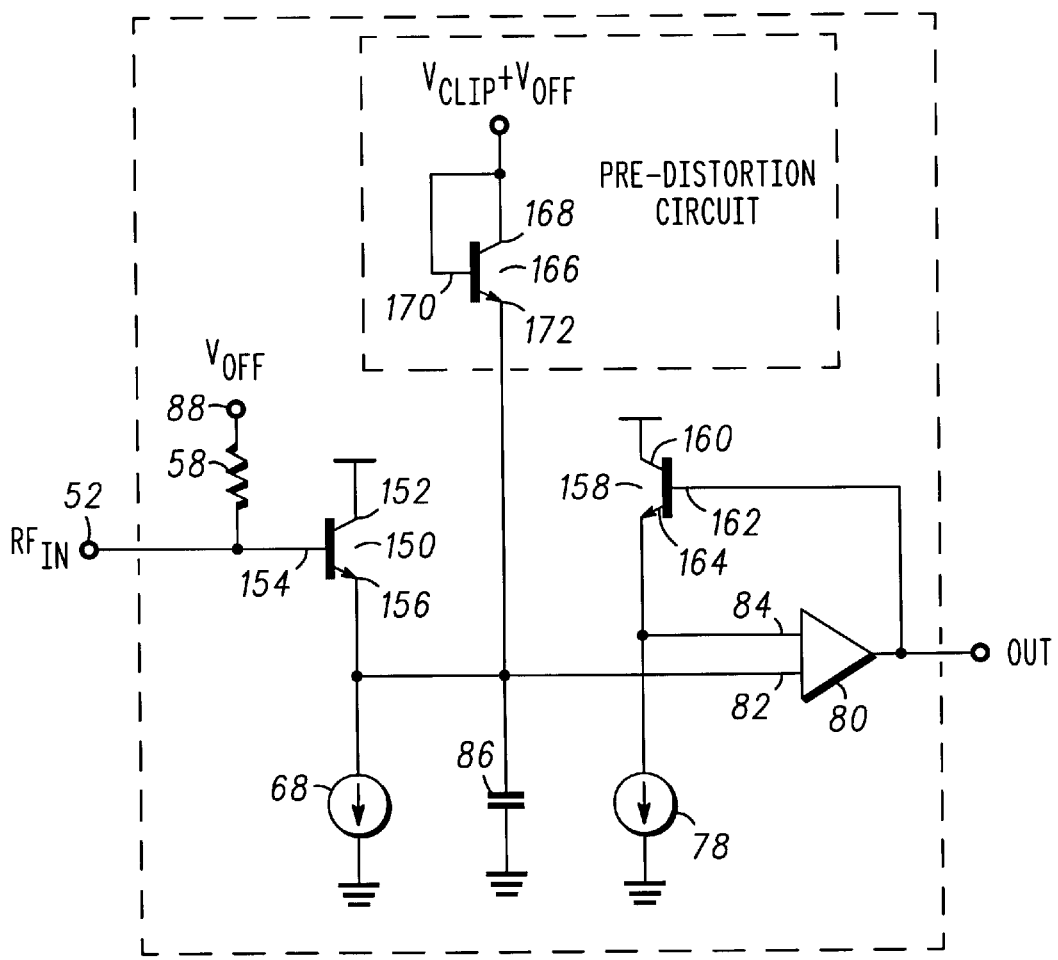
FIG. 5 is a schematic diagram of an alternate embodiment of an envelope detector circuit that includes a predistortion circuit in accordance with the present invention.

An input signal is applied at terminal 52 to the base 154 of transistor 150. The emitter 156 of transistor 150 is coupled to current drain 68 and to a capacitor 86. The node between emitter 156 and capacitor 86 is coupled to one input terminal 82 of an operational amplifier 80.

A second input 84 to the operational amplifier 80 is coupled to the emitter 164 of a second junction transistor 158. The transistors 150 and 158 are matched in size. The emitter 164 is also coupled to a second current drain 178 and the output of the operational amplifier 80 is coupled to the base 162 of transistor 158. The collectors 152 and 160 of respectively transistors 150 and 158 are coupled to the power supply voltage.

Also coupled to the node between emitter 156 and capacitor 86 is the emitter 172 of a third junction transistor 166. Transistor 166 has its base 170 coupled to its collector 168 and to a biasing voltage $V_{CLIP-VOFF}$ Thus the voltage at the node between emitter 156 of transistor 150 and capacitor 86 is maintained at least $V_{CLIP}-V_{OFF}-V_{CB}$, here $V_{CB}$ is the transistor collector to base voltage drop. Transistor 166 is preferably matched in size to the transistors 150 and 158.

The operation of the circuit of FIG. 5 is in material respects the same as the operation of the circuit of FIG. 2. so no additional discussion is required here.

DETAILED DESCRIPTION OF THE INVENTION

Referring to FIG. 1, an amplifier circuit 1 for implementation within a cellular telephone handset or other wireless communications device amplifies a radio frequency (RF) input signal 2 in order to produce a RF output signal 34 for transmission. The RF input signal 2 proceeds to a power amplifier 30 by way of two branches 3, 5 of the amplifier circuit 1. A first branch 3 detects the envelope of the RF input signal 2, and provides a control signal based upon the envelope to a supply voltage terminal 32 of the power amplifier 30 to control the power amplifier. A second branch 5 of the amplifier circuit 1 provides the RF input signal 2 directly to an input terminal 31 of the power amplifier 30. The RF input signal 2 as provided to the input terminal 31 is then amplified by the power amplifier 30 for output as RF output signal 34.

When proceeding through the first branch 3, the RF input signal 2 is first provided to a coupling capacitor 4, which in turn is coupled by way of a node 6 to a modulation circuit 10. The modulation circuit 10 includes, in addition to a battery voltage input terminal 12 and a ground terminal 14, an envelope detector circuit 50 coupled to a class-S modulator 150 at 90, as is known. Further coupled to the modulation circuit are various control signals 13, such as enables, clock, etc. via a SPI port, as are known. The envelope detector circuit 50 is discussed in further detail with respect to FIG. 2. The modulation circuit 10 outputs a pulse width modulated (PWM) signal at an output port 8, which in turn is provided to a filtering network 20 and then provided to the supply voltage terminal 32 of the power amplifier 30. The filtering network 20 filters out AC components from the PWM signal so that a DC signal is provided to the power amplifier 30.

As shown in FIG. 1, in one embodiment the filtering network 20 includes a first inductor 16, which is coupled to the output port 8 and to an internal node 18. Also coupled to the internal node 18 within the filtering network 20 are a second inductor 22, a third inductor 26, and a first capacitor 24. The second inductor 22 is coupled between the internal node 18 and a second capacitor 23, which in turn is connected to the ground. The third inductor 26 and the first capacitor 24 are coupled in parallel between the internal node 18 and the supply voltage terminal 32 of the power amplifier 30. A third capacitor 28 is coupled between the supply voltage terminal 32 and ground. The values of inductors 16, 22 and 26, and capacitors 23, 24 and 28 can be set to obtain various filtering characteristics. In alternate embodiments, other filters can be employed including, for example, a simple low-pass filter having an inductor coupled between output port 8 and supply voltage terminal 32 and a capacitor coupled between the supply voltage terminal and ground.

The power amplifier 30 is a conventional power amplifier having input matching networks 36 coupled between the input terminal 31 and a gate 42 of an amplifier MOSFET 40. A source 44 of the amplifier MOSFET 40 is coupled to ground, while a drain 46 of the MOSFET is coupled to output matching networks 38, which in turn provide RF output signal 34. The drain 46 of the amplifier MOSFET 40 is also coupled to a RF choke 48, which acts as a load for the MOSFET and is in turn coupled to the supply voltage terminal 32. The power amplifier 30 amplifies the RF input signal 2 provided to the input terminal 31 and provides the amplified signal as RF output signal 34. The maximum amount of amplitude variation of the RF output signal 34 that the power amplifier 30 can provide without leaving its linear region of operation is dependent upon the signal applied to the supply voltage terminal 32, which in turn depends upon the envelope of the RF input signal 2. Thus, when the RF input signal 2 has a large envelope, the power amplifier 30 can output the RF output signal 34 with a large degree of amplitude variation, and still remain within its linear operating range. However, when the RF input signal 2 has a small envelope, the power amplifier 30 cannot output the RF output signal 34 with such a large degree of amplitude variation and still remain in its linear operating range.

Turning to FIG. 2, the envelope detector circuit 50 of the modulation circuit 10 of FIG. 1 is shown in greater detail. The envelope detector circuit 50 receives an RF input at an input terminal 52, which is coupled to node 6. The RF input is provided to a gate 64 of a first MOSFET 60, which is a semiconductor device. The gate 64 of first MOSFET 60 is also coupled to a DC biasing or offset voltage ($V_{OFF}$) 88 by way of a resistor 58. A drain 62 of first MOSFET 60 is coupled to the supply voltage. A source 66 of first MOSFET 60 is coupled to a first current source 68 and a capacitor 86, which are coupled to ground. The first current source 68 acts as a current drain and conducts current from source 66 and capacitor 86 to ground. When the RF input received at the input terminal 52 becomes sufficiently high in voltage, the capacitor 86 is charged. When the RF input falls, however, the capacitor 86 discharges through the current source 68.

Source 66 is additionally coupled to a first input terminal 82 of an operational amplifier 80. An output terminal 90 of the operational amplifier 80 is coupled to a gate 74 of a second MOSFET 70, as well as to the class-S modulator 150 shown in FIG. 1. Second MOSFET 70 is the same size as first MOSFET 60, and the two MOSFETS are physically designed to match. A drain 72 of the second MOSFET 70 is coupled to the supply voltage, while a source 76 of the second MOSFET is coupled both to a second current source 78 that conducts current from the source 76 to ground, and also to a second input terminal 84 of the operational amplifier 80. The current conducted by the second current source 78 is designed to be equal to that conducted by the first current source 68. In one embodiment, current sources 68, 78 are transistors the gates of which are tied to the same voltage, and each of the current sources conducts a current of 10μA.

The elements 52 through 90 discussed above form a conventional envelope detector circuit. The first MOSFET 60 operates as a peak detector because the rise time and fall time constants for the source 66 are different. In particular, the rise time depends upon the transconductance ($\Delta I_{GS}/\Delta V_{GS}$) of the first MOSFET 60, while the fall time depends upon a slew rate, i.e., depends upon the ratio of the current conducted by the first current source 68 to the capacitance of capacitor 86. Consequently, increases in the voltage applied to gate 64 produce corresponding increases in the voltage of source 66, while decreases in the voltage applied to the gate do not as quickly produce corresponding decreases in the voltage of the source. The operation of first MOSFET 60 as a peak detector is non-linear. Consequently, the operational amplifier 80 and second MOSFET 70 are employed to linearize the operation of the envelope detector circuit 50. The operational amplifier 80 drives the second MOSFET 70 so that the voltage at source 76 is equal to the voltage at source 66. In order for this to be the case, the voltage applied to gate 74 must be equal to the voltage at gate 64. The overall effect of the second MOSFET 70 is to counteract the non-linearities of the first MOSFET 60. The second MOSFET 70 is able to exactly counteract the non-linearities of the first MOSFET 60 insofar as the two MOSFETS are the same size and physically designed to match.

As shown in FIG. 2, according to the present invention, a predistortion circuit 100 is also included within the envelope detector circuit 50, and is coupled to source 66 of first MOSFET 60. The predistortion circuit 100 includes a third MOSFET 110. The third MOSFET 110 is diode connected to a second DC biasing voltage that is higher than $V_{OFF}$ by a particular amount, $V_{CLIP}$. That is, both a drain 112 and a gate 114 of the third MOSFET 110 are connected to a node 102, which is set to the second DC biasing voltage $V_{CLIP}$ +$V_{OFF}$. The predistortion circuit 100 is coupled to the remainder of the envelope detector circuit 50 by coupling a source 116 of the third MOSFET 110 to the source 66 of the first MOSFET 60.

The predistortion circuit 100 operates to prevent the output voltage of the operational amplifier 80 provided at output terminal 90 from falling below a minimum threshold. The third MOSFET 110 is the same size as, and is physically designed to match, each of the first MOSFET 60 and the second MOSFET 70. Thus, the semiconductor voltage VGS between the gate 114 and source 116 of the third MOSFET 110 is identical to the voltages between the gates 64, 74 and the sources 66, 76 of the first MOSFET 60 and the second MOSFET 70, respectively. Consequently, even when the input signal provided to the gate 64 of first MOSFET 60 has a very small amplitude, i.e., the envelope is very small, the voltage at source 66 cannot fall below a minimum threshold voltage determined by the predistortion circuit 100. The minimum threshold voltage is the difference between the second DC biasing voltage and the semiconductor voltage between the gate 114 and source 116 of the third MOSFET 110, namely, $V_{CLIP}$ +$V_{OFF}$ −$V_{GS}$. Further, because the third MOSFET 110 is the same size as, and is physically designed to match, the second MOSFET 70, the voltage at the output terminal 90 of the operational amplifier 80 cannot fall below the second DC biasing voltage $V_{CLIP}$ +$V_{OFF}$ (since the difference in voltage between the source 76, which voltage must equal that of the source 66, and the gate 74, is equal to the semiconductor voltage $V_{GS}$).

Referring to FIG. 3, transfer functions between an input envelope voltage provided at the input terminals of two different envelope detector circuits and corresponding output voltages at the output terminals of the envelope detector circuits are shown. Specifically, the dashed curve 120 is indicative of the relationship between the input envelope voltage and the output voltage for a conventional envelope detector circuit that lacks the predistortion circuit 100 (e.g., the envelope detector circuit 50 not including the predistortion circuit 100. The solid curve 130 is indicative of the transfer relation between the input envelope voltage and the output voltage for the envelope detector circuit of FIG. 2, which includes the predistortion circuit 100. As shown by curve 130, with the predistortion circuit 100, the output voltage does not fall below a certain minimum threshold even though the input envelope voltage goes to 0. The minimum threshold in this case (i.e., at the output terminal 90) is the second DC biasing voltage, $V_{CLIP}$ +$V_{OFF}$. The exact setting for $V_{CLIP}$ +$V_{OFF}$ can vary depending upon the embodiment of the envelope detector circuit. In one embodiment, $V_{OFF}$ is set to 0.9 volts, while $V_{CLIP}$ is set to 0.4 volts. The preferred setting will depend in part upon the gain of the class-S modulator 150 of the modulation circuit 10, as well as the amplification of the power amplifier 30. The effectiveness of the predistortion circuit 100 diminishes as $V_{CLIP}$ approaches 0.

Although the embodiment of the predistortion circuit 100 that is shown in FIG. 2 includes a MOSFET and operates in conjunction with additional MOSFETS within the envelope detector circuit 50, in alternate embodiments, similar predistortion circuits can be employed using other semiconductor devices in place of MOSFETS. For example, in an envelope detector circuit using bipolar junction transistors, a predistortion circuit can be employed having a bipolar junction transistor in place of third MOSFET 110. In one such embodiment, the bipolar junction transistor is oriented so that a base and a collector of the transistor are coupled to the DC biasing voltage, and an emitter is coupled to the remainder of the envelope detector circuit. Additionally, although the embodiment of the predistortion circuit 100 of FIG. 2 includes current sources 68, 78, which act as current drains, resistors or other devices also can be employed as the current drains.

Referring to FIG. 4, a further embodiment of the predistortion circuit can be employed within a diode-based envelope detector circuit 141. The envelope detector circuit 141 includes a diode 144 coupled between RF input and output terminals 142, 146, respectively, of the envelope detector circuit.

The envelope detector circuit 141 further includes a resistor 148, which acts as a current drain, and a capacitor 149 coupled between the output terminal and ground. The RF input terminal 142 is also coupled to a DC biasing or offset voltage ($V_{OFF}$) 143 by way of a resistor 145. In such an envelope detector circuit, the predistortion circuit is an additional diode 140 coupled between a DC biasing voltage ($V_{CLIP}+V_{OFF}$) and the output terminal 146 of the envelope detector circuit 141. The minimum threshold voltage is again the difference between the DC biasing voltage and the semiconductor voltage across the diode. (The n-terminals of each of the diodes 140, 144 are coupled to output terminal 146.)

While the foregoing specification illustrates and describes the preferred embodiments of this invention, it is to be understood that the invention is not limited to the precise construction herein disclosed. The invention can be embodied in other specific forms without departing from the spirit or essential attributes. Accordingly, reference should be made to the following claims, rather than to the foregoing specification, as indicating the scope of the invention.

What is claimed is:

1. An envelope detector circuit comprising:
    a capacitor;
    a first semiconductor device having a first input port that receives a first input signal and a first out put port coupled to the capacitor that provides current to charge a the capacitor in response to the first input signal;
    a first current drain coupled to the first semiconductor device and the capacitor, the first current drain conducting current away from the capacitor; and
    a second semiconductor device having a second input port that is set to a biasing voltage and a second output port that is coupled to the first output port of the first semiconductor device,
    wherein a voltage level of the first output port is indicative of a level of an envelope of the first input signal when the voltage level remains above a threshold voltage equaling the biasing voltage minus input port to output port voltage, of the second semiconductor device, and the voltage level otherwise does not fall below the a predetermined voltage.

2. The envelope detector circuit of claim 1, further comprising
    an operational amplifier having a first input terminal, a second input terminal and a first output terminal, wherein the first input terminal is coupled to the first output port of the first semiconductor device, wherein the voltage level of the first output port is an intermediate signal, and wherein the first output terminal provides a first output signal based at least in part upon the intermediate signal; and
    a third semiconductor device matched to the first and second semiconductor devices, the third semiconductor device including a third input port that is coupled to the first output terminal of the operational amplifier, and further including a third output port that is coupled to the second input terminal of the operational amplifier,
    wherein the first output signal provided by the operational amplifier is indicative of the level of the envelope of the first input signal when the intermediate signal remains above the threshold voltage, and the first output signal otherwise does not fall below the biasing voltage.

3. The envelope detector circuit of claim 2, wherein the first, second and third semiconductor devices are, respectively, a first transistor device, a second transistor device and a third transistor device.

4. The envelope detector circuit of claim 3, wherein the first, second and third transistor devices are, respectively, a first MOSFET, a second MOSFET and a third MOSFET.

5. The envelope detector circuit of claim 4, wherein a node at the source of the first MOSFET has a rise time dependent on the transconductance of the first MOSFET and a fall time dependent upon the radio of the current conducted by the first current source to the capacitance of the capacitor that differ from one another, and wherein the first MOSFET operates as a peak detector.

6. The envelope detector circuit of claim 4, wherein each of the first input port, second input port and third input port is a gate, and each of the first output port, second output port and third output port is a source.

7. The envelope detector circuit of claim 6, wherein the second MOSFET includes a drain coupled to the second input port such that the drain and the second input port are both set to the biasing voltage.

8. The envelope detector circuit of claim 3, wherein the first, second and third transistor devices are, respectively, a first bipolar junction transistor, a second junction transistor and a third bipolar junction transistor.

9. The envelope detector circuit of claim 8, wherein the second input port is a base, and the second output port is an emitter.

10. The envelope detector circuit of claim 2, further comprising:
    a second current drain coupled to the third output port of the third semiconductor device, wherein both the first current drain and the second current drain are the same type of device; and
    a biasing resistor coupled between the first input port and a second biasing voltage.

11. The envelope detector circuit of claim 2, wherein the first output signal is linearly related to the level of the envelope of the first input signal when the first output signal is above the biasing voltage.

12. An amplifier circuit including the envelope detector circuit of claim 2, the amplifier circuit further comprising:
    a modulator coupled to the envelope detector circuit, the modulator receiving the first output signal of the envelope detector circuit and pulse width modulating the first output signal to produce a second output signal at a modulator output terminal;
    a power amplifier having an RF input terminal, an RF output terminal and a biasing terminal; and
    a filtering circuit coupled between the modulator output terminal and the biasing terminal, the filtering circuit filtering the second output signal and providing the filtered second output signal to the biasing terminal, wherein the power amplifier amplifies an RF input signal applied to the RF input terminal to produce an RF output signal at the RF output terminal, the maximum amount of amplitude variation of the RF output signal the power amplifier can produce without leaving its linear region of operation, varies in response to the filtered second output signal.

13. The amplifier circuit of claim 12, wherein the power amplifier includes input matching networks coupled to the RF input terminal output matching networks coupled to the RF output terminal, an RF choke coupled to the biasing terminal, and an amplifier MOSFET, wherein a gate of the amplifier MOSFET is coupled to the input matching networks and a drain of the amplifier MOSFET is coupled to the RF choke and the output matching networks.

14. The envelope detector circuit of claim 1, wherein each of the first and second semiconductor devices is a diode.

15. In an envelope detector circuit including a first semiconductor device with a first input port and a first output port, a capacitor coupled to the first output port and to a current drain, wherein the first output port provides current to charge the capacitor in response, to a first input signal provided at the first input port, and the current drain conducts current away from the capacitor, the improvement comprising:

a predistortion circuit including a second semiconductor device having at least one port coupled to a biasing voltage and a second port coupled to the first output port of the first semiconductor device, wherein the second semiconductor device provides a signal at the second port which prevents the first output port from failing below a predetermined level.

16. With respect to an RF amplifier that is biased based at least in part upon a level of an envelope of an input signal to the RF amplifier, a method of preventing at least one of nonlinear operation and shutdown of the RF amplifier due to a reduction in the level of the envelope, the method comprising:

providing an envelope detector circuit including a semiconductor device having an output port that is coupled to a capacitor and a current drain, the output port being capable of providing an output signal indicative of the level of the envelope of the input signal;

coupling a predistortion circuit to the output port of the semiconductor device;

receiving the input signal at the envelope detector circuit;

maintaining the output signal above a minimum value when the input signal becomes sufficiently small that, in the absence of the predistortion circuit, the output signal would fall below the minimum value; and providing a biasing signal to the RF amplifier, the biasing signal being functionally related to the output signal.

* * * * *

UNITED STATES PATENT AND TRADEMARK OFFICE
CERTIFICATE OF CORRECTION

PATENT NO. : 6,600,344 B1
DATED : July 29, 2003
INVENTOR(S) : David A. Newman and Benjamin R. Gilsdorf It is certified that error appears in the above-identified patent and that said Letters Patent is hereby corrected as shown below:

<u>Column 7,</u>
Line 45, delete "a".
Line 58, delete the second occurrence of "the".

<u>Column 8,</u>
Line 60, delete "pulse width" and insert -- pulsewidth -- therefor.

Signed and Sealed this

Fifteenth Day of June, 2004

JON W. DUDAS
*Acting Director of the United States Patent and Trademark Office*